US011831308B2

(12) United States Patent
Mori et al.

(10) Patent No.: US 11,831,308 B2
(45) Date of Patent: Nov. 28, 2023

(54) DETECTION DEVICE AND ILLUMINATION SWITCHING DEVICE

(71) Applicant: Murata Manufacturing Co., Ltd., Nagaokakyo (JP)

(72) Inventors: Kenichi Mori, Nagaokakyo (JP); Masamichi Ando, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 638 days.

(21) Appl. No.: 16/847,308

(22) Filed: Apr. 13, 2020

(65) Prior Publication Data

US 2020/0244264 A1 Jul. 30, 2020

Related U.S. Application Data

(63) Continuation of application No. PCT/JP2019/043287, filed on Nov. 5, 2019.

(30) Foreign Application Priority Data

Nov. 6, 2018 (JP) ................. 2018-209220

(51) Int. Cl.
  *H03K 17/96* (2006.01)
  *H10N 30/30* (2023.01)
  *H10N 30/857* (2023.01)
  *H10N 30/00* (2023.01)

(52) U.S. Cl.
  CPC ... *H03K 17/9643* (2013.01); *H10N 30/10513* (2023.02); *H10N 30/302* (2023.02); *H10N 30/857* (2023.02)

(58) Field of Classification Search
  CPC .............. H03K 17/9643; H01L 41/081; H01L 41/1132; H01L 41/193
  See application file for complete search history.

(56) References Cited

U.S. PATENT DOCUMENTS

| 7,589,714 B2 | 9/2009 | Funaki |
| 9,276,191 B2 | 3/2016 | Ando et al. |
| 10,503,291 B2 | 12/2019 | Kihara |

(Continued)

FOREIGN PATENT DOCUMENTS

| JP | 2000182784 A | 6/2000 |
| JP | 2006011646 A | 1/2006 |

(Continued)

OTHER PUBLICATIONS

Written Opinion of the International Searching Authority issued for PCT/JP2019/043287, dated Dec. 17, 2019.

(Continued)

*Primary Examiner* — Albert K Wong
(74) *Attorney, Agent, or Firm* — ArentFox Schiff LLP

(57) ABSTRACT

A detection device includes a panel having opposed main surfaces including an operation surface and a rear surface. A support structure is located on at least one of the main surfaces and prevents warping of the panel while permitting the operation surface to be deformed in response to a pressing operation applied to the operation surface. A sensor for sensing the pressing operation applied to the operation surface is provided on one of the main surfaces at a location where at least a portion of the sensor does not overlap the support structure in plan view.

16 Claims, 6 Drawing Sheets

(56) References Cited

U.S. PATENT DOCUMENTS

| | | | |
|---|---|---|---|
| 10,649,573 B2* | 5/2020 | Kihara | G06F 3/0412 |
| 11,243,632 B2* | 2/2022 | Otera | H01H 13/78 |
| 11,320,942 B2* | 5/2022 | Kitada | H01L 41/047 |
| 2005/0285846 A1 | 12/2005 | Funaki | |
| 2013/0108061 A1 | 5/2013 | Ando et al. | |
| 2017/0177106 A1 | 6/2017 | Kihara | |
| 2019/0066430 A1 | 2/2019 | Kihara | |

FOREIGN PATENT DOCUMENTS

| | | |
|---|---|---|
| JP | 2006038710 A | 2/2006 |
| JP | 2007001701 A | 1/2007 |
| JP | 2007017017 A | 1/2007 |
| JP | 2012049789 A | 3/2012 |
| JP | 2017152323 A | 8/2017 |
| WO | 2016035540 A1 | 3/2016 |
| WO | 2016035682 A1 | 3/2016 |
| WO | 2018025693 A1 | 2/2018 |

OTHER PUBLICATIONS

International Search Report issued for PCT/JP2019/043287, dated Dec. 17, 2019.

* cited by examiner

DETECTION DEVICE AND ILLUMINATION SWITCHING DEVICE

CROSS REFERENCE TO RELATED APPLICATIONS

The present application is a continuation of International application No. PCT/JP2019/043287, filed Nov. 5, 2019, which claims priority to Japanese Patent Application No. 2018-209220, filed Nov. 6, 2018, the entire contents of each of which are incorporated herein by reference.

TECHNICAL FIELD

The present invention relates to a detection device.

BACKGROUND ART

Japanese Patent Application Laid-Open No. 2000-182784 (Patent Document 1) discloses an auxiliary switch for a roof light of a car). In this device, a light is located on the roof of a passenger compartment and a main switch is provided on the light. Since it is sometimes difficult for a user to accurately press the switch, a planar pressure sensitive switch, surrounding the main switch is provided. In this way, if the operator presses in the area of the main switch, but misses the main switch, he or she will still press the auxiliary switch and the light can be turned on or off.

However, the ceiling of a vehicle typically has an inner (lower) wall and an outer (upper) wall. The inner wall is typically supported by the outer wall which has a higher rigidity than the inner wall. The auxiliary switch is located on the inner wall. However, since the displacement of the inner wall in the vertical and horizontal directions is restricted, depending on a location of a support structure of the inner wall, the pressing force applied by the user may not be transmitted to the pressure-sensitive sensor, and thus the pressure-sensitive sensor may not respond.

An object of the invention is to provide a detection device which detects a press on any location of a wall surface.

BRIEF SUMMARY OF THE INVENTION

A detection device according to one aspect of the invention includes a panel having opposed main surfaces including an operation surface and a rear surface. A support structure is located on at least one of the main surfaces and prevents warping of the panel while permitting the operation surface to be deformed in response to a pressing operation applied to the operation surface. A sensor for sensing the pressing operation applied to the operation surface is provided on one of the main surfaces at a location where at least a portion of the sensor does not overlap the support structure in plan view.

The sensor provides an output indicative of a pressing operation applied to the operation surface. A transmitter is connected to the sensor for transmitting an output signal, indicative of the output of the sensor, to a remote receiver.

In a preferred embodiment, the detection device includes first and second sensors located on one of the main surfaces and spaced from one another. The sensor are connected to the transmitter. Each of the sensors provide an output indicative of the pressing operation applied to the operation surface. The output signal transmitted by the transmitter is indicative of the outputs of both of the sensors.

In one aspect of the invention, the support structure includes first and second supports located at spaced locations on at least one of the main surfaces and the sensor is located between the first and second supports. In some aspects of the invention, the supports are located on the rear surface at opposed lateral ends of the operation surface.

In some embodiments, the panel lies in a plane and the first and second supports extend parallel to the plane and parallel to each other. In such an embodiment, the first and second supports can be located at opposite lateral ends of the panel.

When the detection device includes two sensor, the support structure can include a third support located on one of the main surfaces between the first and second supports. The first sensor can be located between the first and third supports and the second sensor can be located between the second and third supports.

In some embodiments, the support structure includes a third support located on one of the main surfaces between the first and second supports in plan view and the sensor overlaps and straddles the third support in plan view.

The sensor can be formed of a piezoelectric member which overlaps and straddles the third support in plan view and first and second electrodes provided on a main surface on the piezoelectric member on opposite sides of the third support, respectively. In some embodiment, wires are provided to connect the electrodes to the transmitter.

When a two or more sensors are used, the transmitter can include a signal comparison unit that compares the outputs of the sensors and generates the transmitted signal as a function thereof.

The transmitter can include a frequency discriminator that determines whether the signal output by the sensor is indicative of an intended input as a function of a frequency of the output of the sensor or sensors.

The invention is also directed to an illumination switching device that includes a light source and a switch to turn the light source on and off. In such an illumination switching device, the detection device described above is used to control the operation of the switch. More specifically, the switch can be controlled by the remote receiver as a function of the output signal generated by the transmitter. In a preferred embodiment, a determination is made as to whether to switch the switch by the signal comparison unit, the frequency discrimination unit, or both the signal comparison unit and the frequency discrimination unit.

In some embodiments, the sensor is located on the operation surface and the detection device further comprises a surface film which is provided on the operation surface in such a manner that the sensor is sandwiched between the operation surface and the surface film. The surface film preferably covers the entire operation surface.

A detection device of the invention can detect a press on any location on a panel.

DETAILED DESCRIPTION OF THE PREFERRED EMBODIMENTS

Figure 1:
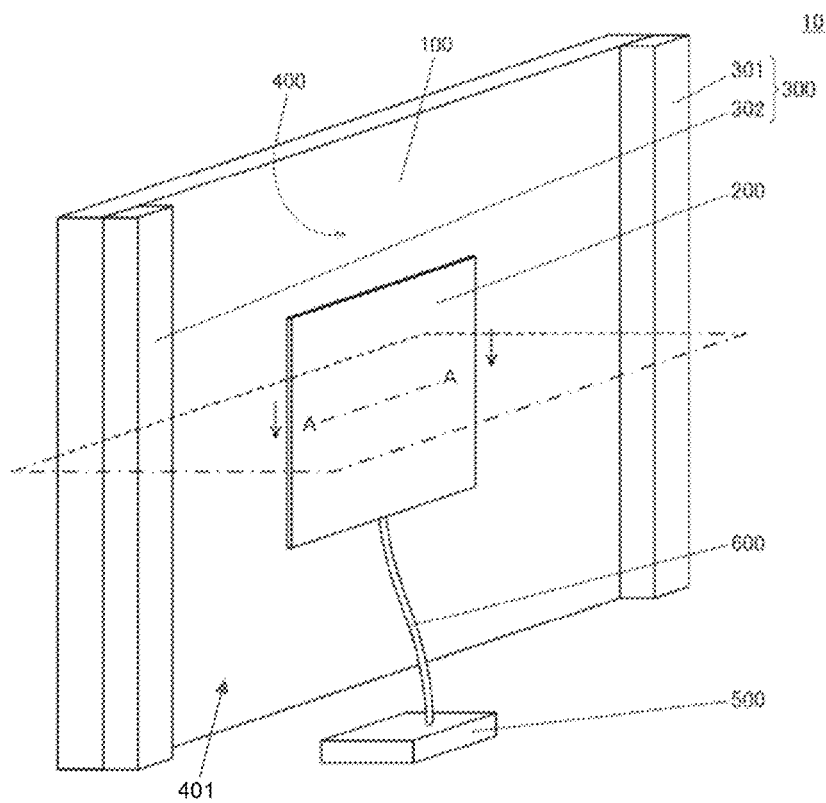
FIG. 1 is an external perspective view of a detection device according to a first embodiment.

Referring now to the drawings, wherein like numerals indicate like elements, FIGS. 1-5 illustrate an exemplary detection device 10 according to a first embodiment of the invention. Detection device 10 includes a panel 100, a sensor 200, a support structure 300, an operation surface 400, a transmitter 500, and a wire 600 (a wireless connector can also be used).

The panel 100 includes opposed, preferably flat, opposed front and back main surfaces 400, 401, respectively. In the present embodiment, the front main surface functions as an operation surface 400. The panel can be, for example, a wall panel used as a residential building material or a flat panel such as a window or a top board of a desk. While a flat panel is preferred, the shape of the panel 100 is not limited to a flat plate shape or a rectangular shape, and may be a shape curved in a surface direction or a shape such as a circle, an ellipse, or a polygon. Further, the panel may, by way of example, have a structure in which a plurality of panel layers are laminated to one another or may be made of plywood.

In the present embodiment, a support structure 300 (which, in this embodiment includes first and second supports 301, 302) is disposed on the rear main surface 401 and preferably extends parallel to the rear main surface 401. The first and second supports 301 are located at opposite ends of the rear main surface 401 and extend parallel to each other. In this embodiment, each of the supports 301 extend from the lower to the upper edge of the panel 100, but the invention is not so limited. For example, the support structure 300 may be provided to surround the entire periphery of panel 100. Further, the support 301, 302 may not extend parallel to each other, and may be provided to have a certain angle there between.

The support structure 300 is used to prevent deformation/warping of the panel 100 and to stabilize the posture of the panel 100. For example, the support structure 300 may be a panel member such as a bar or a window which is disposed along the rear main surface 401 of the panel 100 and is attached to the wall, or may be a member such as a desk leg or a door hinge which is attached to the panel 100 vertically or at a fixed angle. In case of a desk or the like, a configuration in which only one leg is provided is conceivable. In this case, the support structure 300 is preferably a member having an extending direction (e.g., the vertical direction as viewed in FIG. 1). The extending direction can also be, for example, a rectangle or an ellipse in plan view. In this case, it is difficult for the panel to be bent in the extending direction of the support structure 300, and it is easy for the panel 100 to be bent in a direction substantially perpendicular to the extending direction of the support structure 300. That is, the panel 100 has a direction in which the panel 100 is easily bent. Further, the support structure 300 may include a single support or multiple supports.

The sensor 200 is disposed on the rear main surface 401 of the panel 100 at a position where the support structure 300 is not located (e.g., at a position between the supports 301 and 302. Since the sensor 200 is disposed on the rear main surface 401 of the panel 100 (the side opposite to the operation surface 400), the sensor 200 is not stressed when the operator is not applying pressure to the operation surface.

As a result, a stress greater than the deformation of the panel 100 is not applied to the sensor 200, so that the possibility that the sensor 200 is directly applied with a stress by an external factor such as an operator's operation is reduced. Here, the operator's operation refers to an operation that causes deformation or vibration of the panel 100, such as knocking the panel 100 with a hand.

In a case where an external force is applied in a direction perpendicular to the main surface of the panel 100 in a region where the support structure 300 is not disposed, the region of the panel 100 is easily bent in the surface direction. Further, even in a case where the operator performs an operation in a region of the panel 100 which is near the support structure 300, the displacement of the region in the surface direction in the propagation of vibration or bending due to the operation is increased.

Therefore, by disposing the sensor 200 on the panel 100 in a region where the support structure 300 is not disposed, the deformation of the panel is easily detected, and the sensitivity of the sensor is improved. With this configuration, an operation at any (or at least substantially any) position on the panel 100 can be detected, and a signal can be detected even if the panel 100 is somewhat thick.

The wire 600 connects the sensor 200 to the transmitter 500 such that a signal produced by the sensor 200 (and indicating that the panel 100 is bent by the user pressing on the operation surface) is transmitted to the transmitter 500. The transmitter 500 transmits a signal to an external receiving unit or signal processing unit (not illustrated) according to the strength of the signal. The transmitter 500 transmits a signal to, for example, a switch for a light, and performs an operation such as dimming or turning the light on or off. The detection device 10 according to the invention may include a filter unit (not illustrated) which filters out non intended user input pressing operations as a function of the frequency of the operation input frequency.

The specific frequency may be, for example, relatively low frequency vibration derived from an operation of leaning on the panel 100, an earthquake, or a vehicle passing near an installation location of the panel 100, or very high frequency vibration emitted from home appliances or electronic devices. In a case where the filter unit is provided, the detection device 10 can exclude a specific frequency such as an unintended contact of the operator, and can more reliably detect the operator's operation.

Further, the transmitter 500 may include a signal discrimination unit that can control a signal transmitted from the transmitter 500 by a specific operation. The signal discrimination unit transmits, to the outside, a command that is set in advance according to the number or interval of signals, the state of the external receiving unit, and the like. For example, it is possible to discriminate turning on by an operation at the time of detecting turning off, or turning off by an operation at the time of detecting turning on such that illumination is turned on by an operation of tapping the panel 100 n (positive integer) times, illumination is turned off by tapping the panel 100 n+1 times, and child lock is performed by tapping the panel 100 n+k (k is positive integer) times or more.

Figure 2:
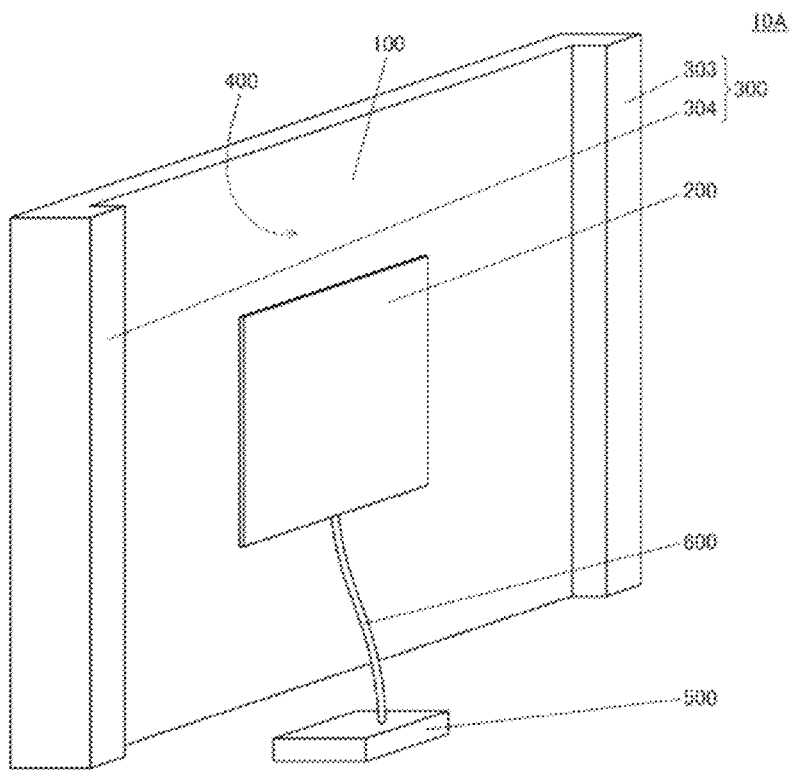
FIG. 2 is an external perspective view illustrating a modification of the detection device according to the first embodiment.
Figure 3:
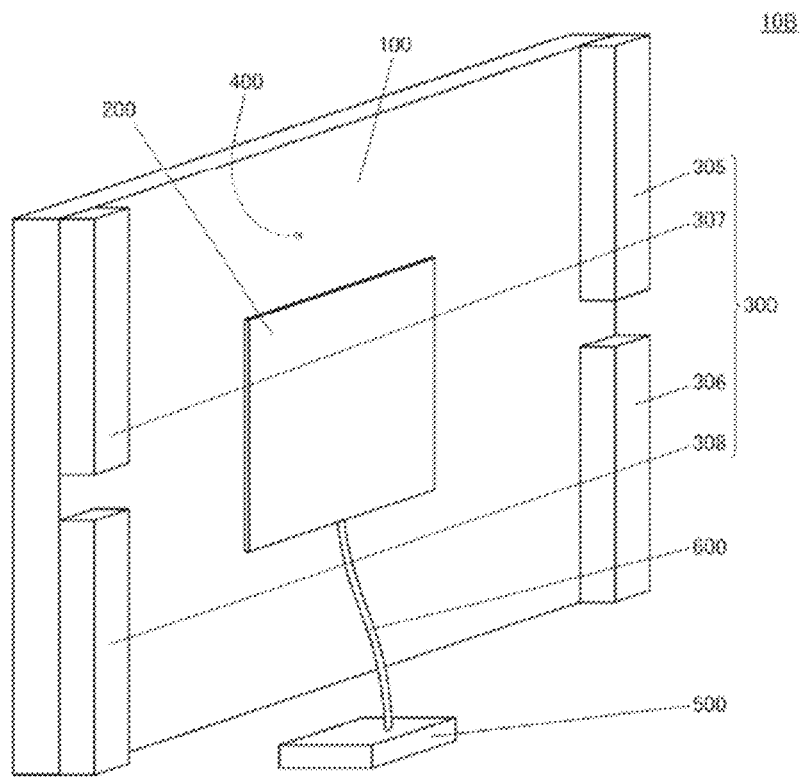
FIG. 3 is an external perspective view illustrating a modification of the detection device according to the first embodiment.

FIGS. 2 and 3 are relatively minor modifications of the detection device 10 according to the first embodiment of the invention. In FIG. 2, the support structure 300 (which includes first and second supports 303 and 34) are formed integrally with the panel. Like the embodiment of FIG. 1, these have an effect of suppressing deformation of the panel 100. That is, as in the first embodiment, since the sensor 200 is disposed in a region of the panel 100 where the first support structure 303 and the second support structure 304 are not disposed, there is a region where the panel 100 is easily bent, and therefore, it is possible to reliably detect the operator's operation on the panel 100.

In FIG. 3, the support structure 300 includes four separate supports, so that it is possible to dispose a wire or the like between the individual supports in the same extending direction. As with the structure shown in FIG. 1, this structure has the effect of increasing the support of the panel 100. More particularly, as in the first embodiment, since the sensor 200 is disposed in a region of the panel 100 where the supports 305, 306, 307, and 308 are not disposed, there is a region where the panel 100 is easily bent, and therefore, it is possible to reliably detect the operator's operation on the panel 100.

In the preferred embodiments, the sensor 200 may be formed of a piezoelectric film. The piezoelectric film is preferably poly-L-lactic acid (PLLA). PLLA is a chiral polymer, and the main chain has a helical structure. PLLA is uniaxially stretched, and when molecules are oriented, PLLA becomes piezoelectric. Then, the uniaxially stretched PLLA is pressed in a thickness direction perpendicular to the stretching direction and generates an electric charge by being bent.

At this time, the amount of electric charges generated is uniquely determined depending on the amount of displacement that one main surface is pressed to be displaced in a direction orthogonal to the one main surface. The piezoelectric constant of the uniaxially stretched PLLA belongs to a very high class in polymers.

Therefore, by using PLLA, it is possible to reliably detect displacement due to press with high sensitivity. That is, it is possible to reliably detect the press and detect the press amount with high sensitivity. The stretching ratio is preferably about 3 to 8 times. By performing a heat treatment after the stretching treatment, crystallization of the extended chain crystal of polylactic acid is promoted, and the piezoelectric constant is improved. In case of biaxial stretching, the same effect as uniaxial stretching can be obtained by making the stretching ratio of each axis different.

For example, in a case where stretching is performed eight times in an X-axis direction with a certain direction as an X axis and twice in a Y-axis direction orthogonal to the X axis, regarding the piezoelectric constant, it is possible to obtain approximately the same effect as in a case where uniaxial stretching is performed four times in the X-axis direction. Since the simply uniaxially stretched film is easily torn along the stretching axis direction, the strength can be increased somewhat by performing the above-described biaxial stretching.

In addition, PLLA generates piezoelectricity by the molecular orientation treatment by stretching, and does not require a poling treatment unlike polymers such as PVDF and piezoelectric ceramics. That is, piezoelectricity is expressed not by polarization of ions as in a ferroelectric, but expressed by a helical structure which is a characteristic structure of a molecule itself.

Therefore, PLLA does not have pyroelectricity generated by other ferroelectric piezoelectric materials. Further, the piezoelectric constant of PVDF and the like is changed over time, and in some cases, the piezoelectric constant is significantly decreased, but the piezoelectric constant of PLLA is extremely stable over time. Therefore, it is possible to detect displacement due to press with high sensitivity without being affected by the surrounding environment.

Figure 4:
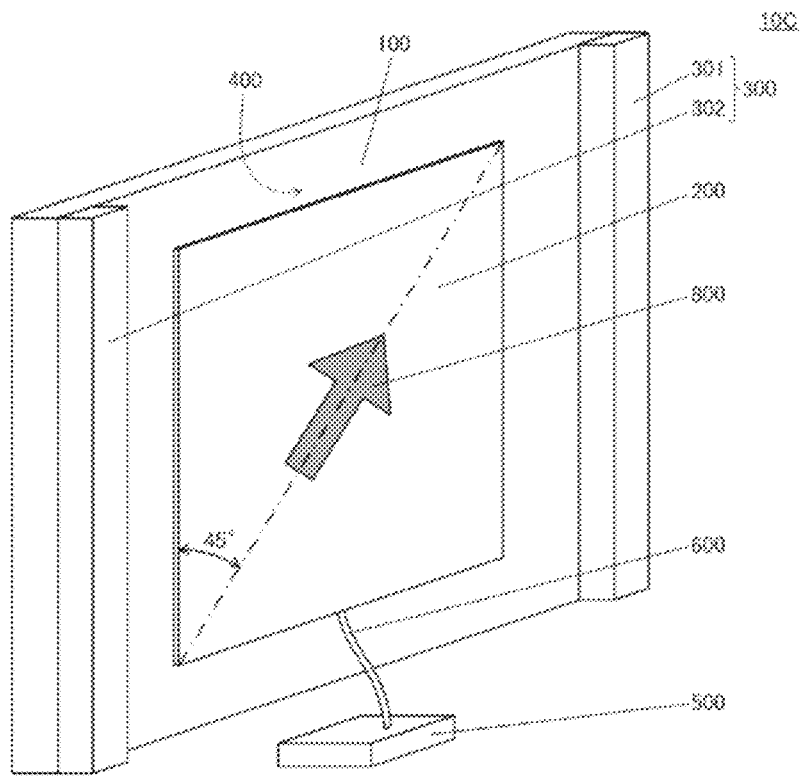
FIG. 4 is an external perspective view of the detection device according to the first embodiment.

FIG. 4 illustrates an embodiment using a PLLA film for the sensor 200 according to the first embodiment of the invention. The PLLA film is preferably disposed on the panel 100 such that a uniaxial stretching direction 800 forms an angle of approximately 45° with respect to two orthogonal axes along the side surface of the panel 100 as illustrated in FIG. 4. By disposing the PLLA film in this manner, it is possible to detect the displacement in a side surface direction as a direction in which the panel 100 is easily deformed with high sensitivity. Therefore, the operation by the operator can be detected with higher sensitivity. Here, approximately 45° indicates a range of 45±10°.

Figure 5:
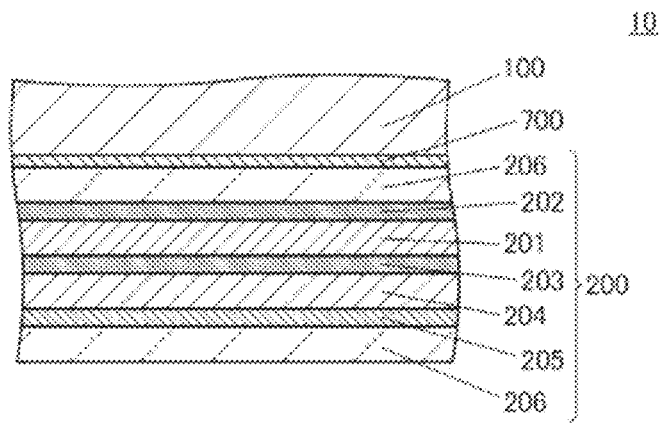
FIG. 5 is a cross-sectional view of the detection device according to the first embodiment.

FIG. 5 is a A-A cross-sectional view of the detection device 10 according to the first embodiment of the invention. The cross-sectional view is a view in which the detection device 10 is viewed from the cross-sectional direction along the broken line A-A in FIG. 1. As illustrated in FIG. 5, the sensor 200 is attached to the panel 100 via an adhesive member 700 such as a double-sided tape.

The sensor 200 includes a piezoelectric film 201, a first electrode 202, a second electrode 203, an insulator 204, a shield electrode 205, and protection members 206. Further, the sensor 200 is fixed to the panel 100 by the adhesive member 700.

The piezoelectric film 201 has the first electrode 202 which is disposed on a first main surface on the panel 100 side of the piezoelectric film 201 and the second electrode 203 which is disposed on a second main surface on a side opposite to the panel 100.

In each of the electrodes, the first electrode 202 is a ground electrode, and the second electrode 203 is a signal detection electrode. By providing the ground electrode on the panel 100 side, an electrical noise signal is cut off by the ground electrode, so that it is possible to suppress the influence of the electrical noise from the panel 100 side on the signal detection electrode. The piezoelectric film 201 generates electric charges as the panel 100 is deformed.

The sensor 200 further includes the shield electrode 205 which is disposed on the second electrode 203 via the insulator 204, on a side opposite to the panel 100.

With this configuration, it is possible to suppress the influence of noise from a side opposite to panel 100. The sensor 200 includes the protection members 206. The protection members 206 are disposed on a main surface of the first electrode 202 of the sensor 200 on the panel 100 side and on a main surface of the shield electrode 205 on a side opposite to the panel 100, respectively. The protection member 206 has, for example, heat resistance, moisture resistance, ultraviolet resistance, and the like. With this configuration, it is possible to prevent the sensor 200 from being deteriorated due to an external influence.

Figure 6:
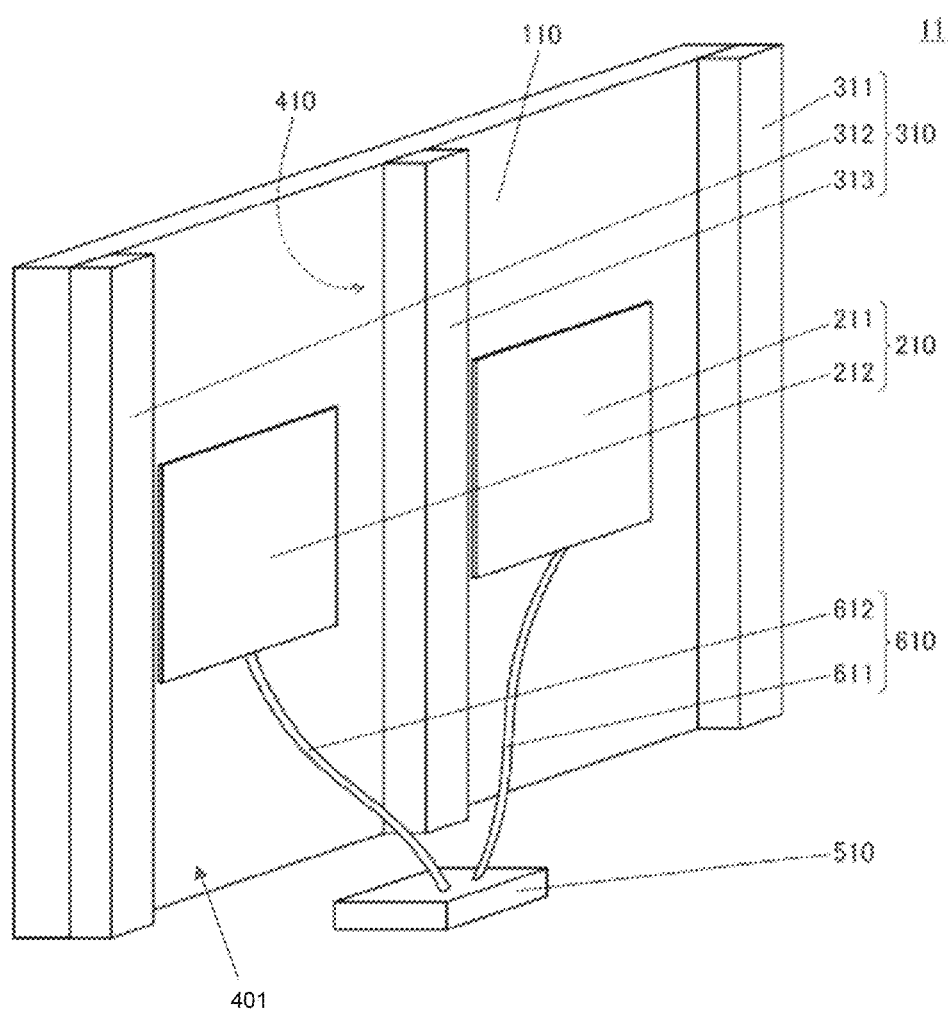
FIG. 6 is an external perspective view of a detection device according to a second embodiment.

FIG. 6 is an external perspective view of a detection device 11 according to a second embodiment of the invention. As illustrated in FIG. 6, the detection device 11 includes a panel 110, a plurality of sensors 210, a support structure 310 (comprising three supports 311, 312 and 313), an operation surface 410, a transmitter 510, and a plurality of wires 610. The sensor 210 includes, a first sensor 211 and a second sensor 212 (additional sensors can be used).

The supports 311, 312 and 313 extend parallel to one another in the height direction of the panel 11. Supports 311, and 312 are located on opposite lateral edges of the rear surface 401 of the panel and the support 313 is disposed between the supports 311 and 312, preferably half way between supports 311 and 312 and in the middle of the panel 110.

The first sensor 211 is located between (and preferably in the middle of) the supports 311 and 313, and the second sensor 212 is located between (and preferably in the middle of) the supports 312 and 313. With this structure, each of the sensor 211 and 212 are disposed in a region where the support structure 310 is not disposed. The wires 610 include a first wire 611 which extends from the first sensor 211 to the transmitter 510 and a second wire 612 which extends from the second sensor 212 to the transmitter 510. The transmitter 510 transmits an operation signal to a remote receiving device as in the first embodiment.

The transmitter 510 compares the signals received from the first and second sensors 211 to obtain further information concerning the pressing operation applied to the operation surface 410. For example, when the strength of the signal received from the first sensor 211 is greater than the strength of the signal received from the second sensor 212, it is determined that the operator has pressed a region of the operation surface 410 that is located between the first and the third support structures 311 and 313. With this configuration, it is possible to determine which region of the panel 110 has been operated by the operator. This information can be transmitted by the transmitter to a remote receiver.

Even though the panel 110 has been divided into a plurality of regions by the support structure 310, it is possible to reliably detect a user input operation in each region by placing the sensor 210 in each region. Note that the invention is not limited to the embodiment illustrated in FIG. 6, the sensors may be disposed at three or more locations and the support structures may be disposed at four or more locations.

Figure 7:
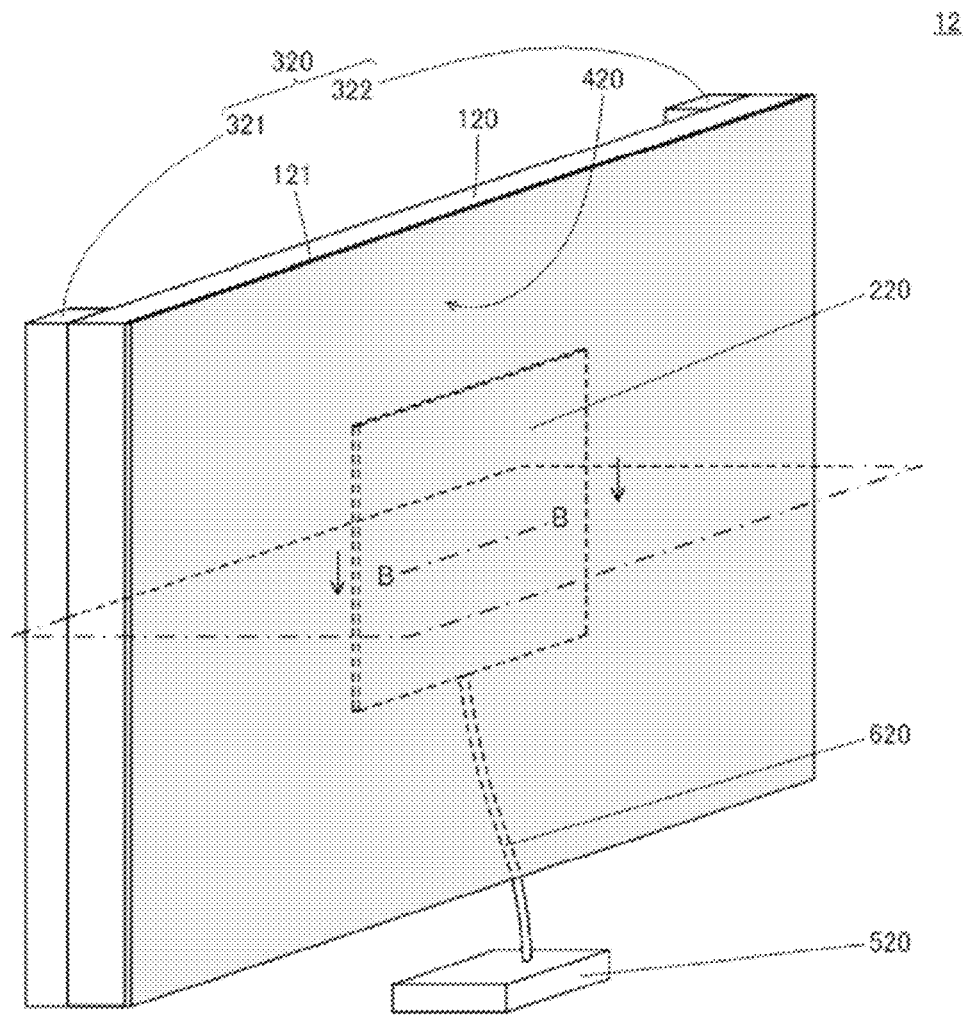
FIG. 7 is an external perspective view of a detection device according to a third embodiment.

FIG. 7 is an external perspective view of a detection device 12 according to a third embodiment of the invention. In this embodiment, the sensor is placed on the operation surface of the panel and is covered by a surface film, such as wallpaper.

As illustrated in FIG. 7, the detection device 12 includes a panel 120, a sensor 220, a support structure 320, an operation surface 420, a transmitter 520, a wire 620, and a surface film 121. The panel 120 has the surface film (such as wall paper) 121 disposed on the operation surface 420. The support structure 320 includes first and second supports 321, 322 which extend parallel to one another (in the height direction of the panel 120) and are located at opposite lateral ends of the panel 120.

The sensor 220 is disposed on the operation surface 420 and is located between the operation surface 420 and the surface film 121 in a region where the support structure 320 is not disposed in plan view. The wire 620 extends from the sensor 220 to the transmitter 520 and is preferably disposed between the panel 120 and the surface film.

The wire 620 may be disposed only on the operation surface 420 side of the panel 120, but may be wired, for example, on the main surface of the panel 120 which opposes the operation surface 420 by providing a through-hole or the like on the panel 120. Further, the wire 620 may be configured by a flat cable in which case, since the thickness of the wire is reduced, it is possible to suppress the influence of the thickness of the wire on the surface film 121.

With this configuration, even if the operator does not perform an operation directly at the location of the sensor 220, it is possible to prevent the sensor 220 from being deteriorated due to an external influence such as the operator's operation. It is preferable that the thickness of the surface film (as measured perpendicular to the plane of the operation panel) be greater than that of the sensor. By using a surface film that is thicker than a sensor, it is possible to reliably suppress deterioration.

Further, since the sensor 220 is disposed between the surface film 121 and the panel 120, the attachment and detachment of the sensor 220 is easier than it is when the sensor 220 is disposed on the main surface of the panel 120 (the rear of the panel) which opposes to the operation surface 420.

Further, as in the first embodiment, since the sensor 220 is disposed in a region of the panel 120 where the support structure 320 is not present, the sensor 220 is provided in a region where the panel 120 is easily bent, so that it is possible to reliably detect the press.

Figure 8:
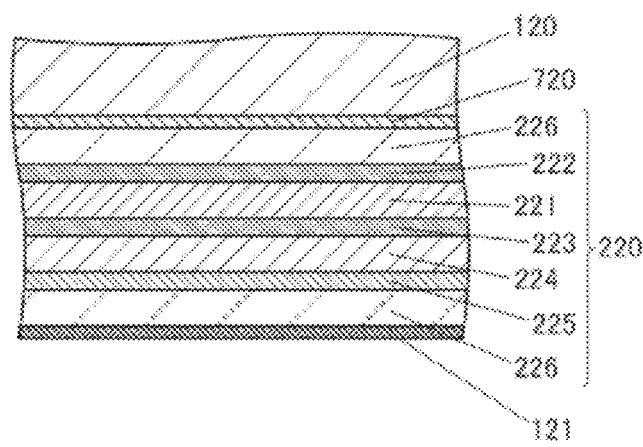
FIG. 8 is a cross-sectional view of the detection device according to the third embodiment.

FIG. 8 is a B-B cross-sectional view according to the third embodiment of the invention. The cross-sectional view is a view in which the detection device 12 is viewed from the cross-sectional direction along the broken line B-B in FIG. 7. As illustrated in FIG. 8, the sensor 220 of the detection device includes a piezoelectric film 221, a first electrode 222, a second electrode 223, an insulator 224, a shield electrode 225, and protection members 226. The sensor 220 is fixed to a main surface of the panel 120 on the operation surface 420 side via an adhesive member 720. By fixing the sensor 220 to the panel 120, it is possible to accurately detect the deformation of the panel 120.

The piezoelectric film 221 has a first main surface facing the panel 120 and an opposed second main surface facing the surface film 121. The first electrode 222 is disposed on the first main surface, the second electrode 223 is disposed on the second main surface, and the first electrode 222 is a ground electrode. The shield electrode 225 is disposed on the surface film 121 side of the second electrode 223 via the insulator 224.

The protection layers 226 are disposed on the surface film 121 side of the shield electrode 225 and the panel 120 side of the first electrode 222, respectively. With this configuration, the influence of noise to the sensor 220 from the surface film 121 side and the panel 120 side can be suppressed.

Figure 9:
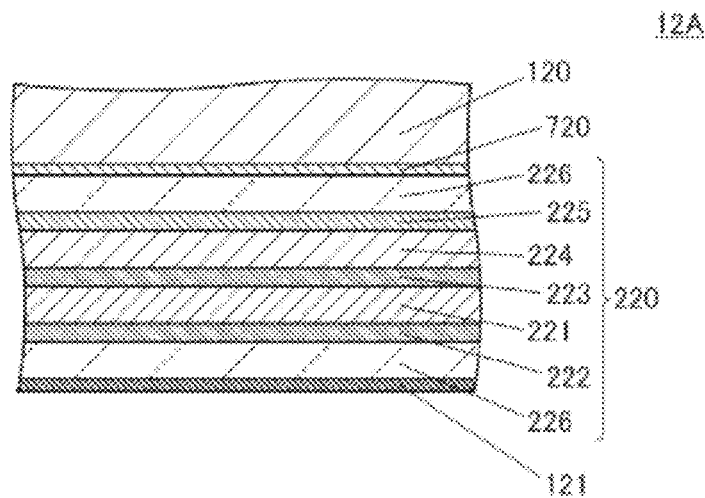
FIG. 9 is a cross-sectional view illustrating a modification of the detection device according to the third embodiment.

FIG. 9 is a cross-sectional view of a detection device 12A according to a modification of the third embodiment of the invention. Like FIG. 8, FIG. 9 is a cross-sectional view of the panel 120 taken along the broken line B-B in FIG. 7. FIG. 9 is a modification of FIG. 8, and therefore only the differences will be described. In FIG. 9, the shield electrode 225 is disposed on the panel 120 side of the first electrode 222 via the insulator 224, and the second electrode 223 is a ground electrode. Even in the configuration of FIG. 9, similar to FIG. 8, it is possible to suppress the influence of noise from the surface film 121 side and the panel 120 side.

Further, the protection member 226 may have moisture resistance, heat resistance, and ultraviolet resistance.

In this case, the reliability of the sensor is improved by the protection member 226.

Figure 10:
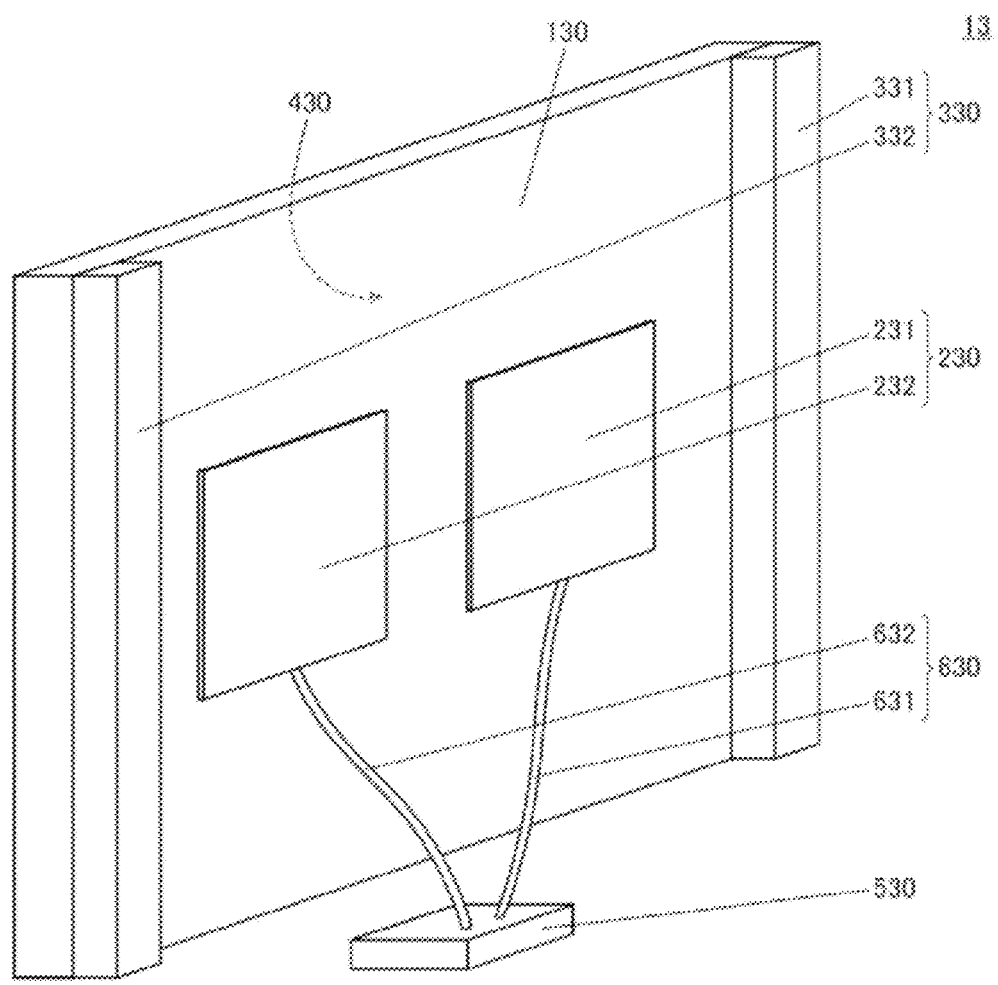
FIG. 10 is an external perspective view of a detection device according to a fourth embodiment.

FIG. 10 is an external perspective view of a detection device 13 according to a fourth embodiment of the invention. As illustrated in FIG. 10, the detection device includes a panel 130, a sensor 230, a support structure 330, an operation surface 430, a transmitter 530, and a plurality of wires 630. The support structure 330 includes first and second supports 331 and 332 located on opposite lateral ends of the panel 130. The sensor 230 includes first and second sensors 231 and 232. Each sensor 231, 232 is disposed between the first and second supports 331 and 332.

First and second wires 631 and extend from the first and second sensors 231 and 232, respectively, to the transmitter 530. Since the first sensor 231 and the second sensor 232 are disposed side by side in the horizontal direction, it is possible distinguish the location of a pressing operations on the operation surface 430 in two different regions in the horizontal direction. When the first and second sensors 231 and 232 both use uniaxially stretched PLLA, the stretching axis directions thereof may be different. In such a case, the polarity of the output of the sensor differs depending on the location where the wall is operated, so that it is possible to more accurately specify the operated location. Further, the sensors may be disposed side by side at any angle such as a vertical direction or a 45° direction regardless of the horizontal direction. In this case, it is possible to distinguish operations along a direction in which the sensors 230 are disposed side by side.

In a case where a plurality of sensors are provided between the support structures as described above, even when the support structure 330 is not arranged between the plurality of sensors 230, it is possible to discriminate which region of the panel 130 has been operated by the operator.

Figure 11:
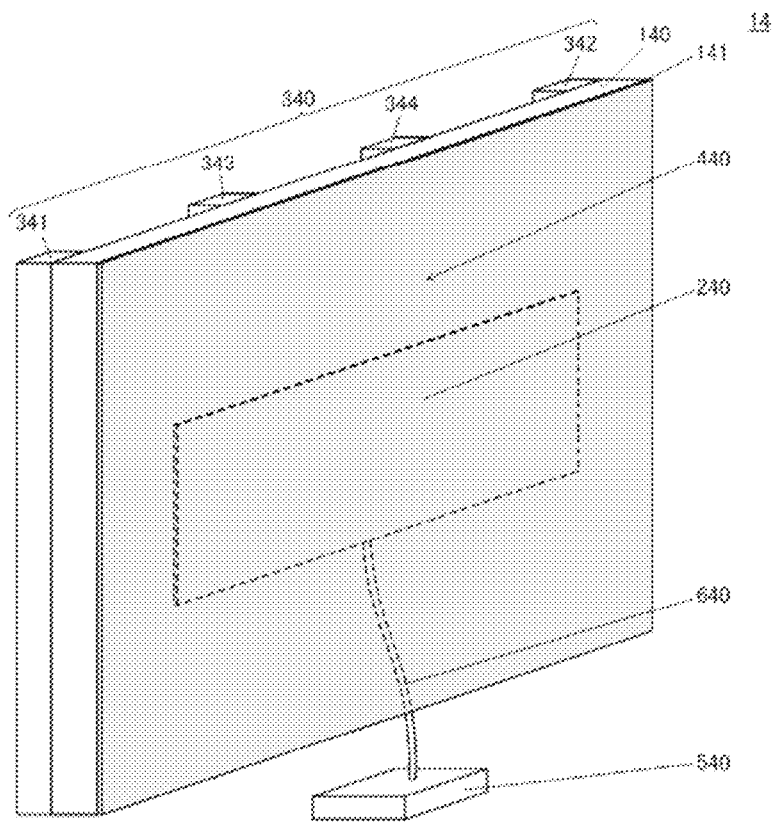
FIG. 11 is an external perspective view of a detection device according to a fifth embodiment.

FIG. 11 is an external perspective view of a detection device 14 according to a fifth embodiment of the invention. As illustrated in FIG. 11, the detection device 14 includes a panel 140, a surface film 141, a sensor 240, a support structure 340, an operation surface 440, a transmitter 540, and a wire 640. As in the third embodiment, the panel 140 includes the surface film 141 located on the operation surface 440.

The sensor 240 is disposed on the operation surface 440 side between the operation surface 440 and the surface film 141. The support structure 340 includes first, second, third and fourth supports 341, 342, 343, and 344, each of which extend in the vertical (height) direction of the panel 140 and are disposed parallel to each other and equally spaced from one another with the outer supports 341 and 342 being located on opposite later ends of the panel 14 and the inner supports 343 and 344 being located there between. The sensor 240 extend over the inner supports 343 and 344 and therefore extends to each respective area between adjacent supports. However, the sensor 240 does not extend to the outer supports 341 and 342.

The sensor 240 is disposed on the main surface (the operation surface 440) of the panel 140, between the outer supports 341 and 342. When the operator applies a pressing operation the vicinity of the inner support 344, the panel 140 is bent slightly with the supports 342 and 343 (which are adjacent to the support 344) as fulcrums. However, since the sensor 240 extend from the support 342 to the support 343, even if the panel is slightly bent, it is possible to detect the deformation of the panel. Therefore, even when the operator presses the operation surface 440 in the area of the support 344, it is possible to detect the pressing operation.

As described above, in a case where the support structure overlapping the sensor 240 when the panel 140 is viewed in plan view in the vertical direction of the panel surface is disposed between other support structures, it is possible to detect the operation by the operator at any location of the panel 140 in which the plurality of support structures 340 are disposed.

Figure 12:
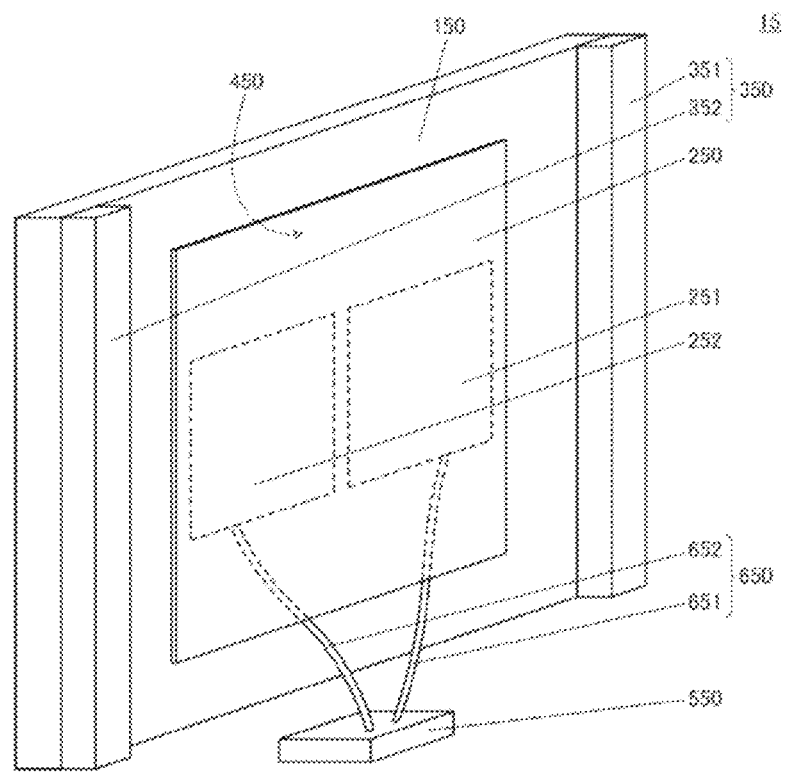
FIG. 12 is an external perspective view of a detection device according to a sixth embodiment.

FIG. 12 is an external perspective view of a detection device 15 according to a sixth embodiment of the invention. As illustrated in FIG. 12, the detection device 15 includes a panel 150, a sensor 250, a support structure 350, an operation surface 450, a transmitter 550, and wires 650.

The sensor 250 is disposed on a rear main surface of the panel 150 which opposes the operation surface 450. The sensor 250 includes a piezoelectric film and first and second signal detection electrodes 251 and 252 are disposed at spaced locations on a single piezoelectric film. The detection electrodes 251 and 252 are preferably coplanar (are located in the same plane) and parallel to the plane of the panel 150. A wire 651 extends from the first signal detection electrode 251 to the transmitter 550, and a wire 652 is extended from the second signal detection electrode 252 to the transmitter 550.

The support structure 350 includes a first and second supports 351 and 352, located on opposite lateral ends of the panel 150, each of which is disposed on the rear main surface of the panel 150 which is opposed to the operation surface 450. When the operator presses the operation surface 450, the distortion of the panel 150 causes a charge distribution on the piezoelectric film according to the position where the pressing operation was made. As a result, the output signals generated by the first and second detection electrodes 251 and 252 will be different due to the disposition of the electrodes on the piezoelectric film and the operation position. By comparing the signals output by the first and second signal detection electrodes 251 and 252, the detection device can discriminate which region of the panel 150 has been operated by the operator (i.e., the position at which the operator pressed on the operation surface).

The number of signal detection electrodes is not limited to two, and three or more signal detection electrodes may be provided on a single piezoelectric sensor provided in the sensor 250. In this case, the sensor 250 can identify at least regions equal to or greater than the number of the provided signal detection electrodes.

Further, the sensor 250 is disposed in a region where the support structure 350 is not present in plan view. A plurality of sensors 250 may be disposed on the main surface of the panel 150 on a side opposite to the operation surface 450.

DESCRIPTION OF REFERENCE SYMBOLS

100: panel
200: sensor
201: piezoelectric film
202: first electrode
203: second electrode
204: insulator
205: shield electrode
206: protection member
300: support structure
301: first support structure
302: second support structure
400: operation surface
500: transmitter
600: wire

The invention claimed is:

1. A detection device comprising:
a panel having opposed main surfaces including an operation surface and a rear surface;
a support structure which prevents warping of the panel while permitting the operation surface to be deformed in response to a pressing operation applied to the operation surface, the support structure comprising first, second and third supports, each located on a respective one of the main surfaces of the panel, the third support being located between the first and second supports in plan view; and first and second sensors provided on respective ones of the main surfaces of the panel for sensing the pressing operation applied to the operation surface, the first sensor being located between the first and third supports in plan view, the second sensor being located between the second and third supports in plan view, at least a portion of the first sensor does not overlap the support structure in plan view.

2. The detection device according to claim 1, wherein:
the first and second sensors provide respective outputs indicative of the pressing operation applied to the operation surface; and
the detection device further includes a transmitter receiving the respective outputs of the first and second sensors and transmitting an output signal, indicative of the pressing operation, to a remote receiver.

3. The detection device according to claim 1, wherein the first, second and third supports are located on the rear surface.

4. The detection device according to claim 3, wherein the supports are located at opposed lateral ends of the rear operation surface.

5. The detection device according to claim 1, wherein the panel lies in a plane and the first and second supports extend parallel to the plane and parallel to each other.

6. The detection device according to claim 5, wherein the first and second supports are located at opposite lateral ends of the panel.

7. The detection device according to claim 1, wherein the first and second sensors are respective portions of a single sensor that overlaps and straddles the third support in plan view.

8. The detection device according to claim 7, wherein the single sensor comprises:
a piezoelectric member which overlaps and straddles the third support in plan view; and
first and second electrodes provided on a main surface on the piezoelectric member on opposite sides of the third support, respectively.

9. The detection device according to claim 1, wherein the support structure is integrally formed with the panel.

10. The detection device according to claim 1, wherein:
the first and second sensors provide respective outputs that are indicative of the pressing operation applied to the operation surface; and the outputs of the first and second sensors are connected to a transmitter that transmits a signal to a remove receiver, the transmitter includes a signal comparison unit that compares the outputs of the first and second sensors and the transmitter generates the transmitted signal as a function of the comparison.

11. The detection device according to claim 1, wherein:
the first sensor generates an output indicative of the pressing operation applied to the operation surface; and
the detection device includes a transmitter connected to the first sensor and transmitting a signal to a remote receiver, the transmitter including a frequency discriminator that determines whether the output generated by the first sensor is indicative of an intended pressing operation as a function of a frequency of the output of the sensor.

12. The detection device according to claim 1 wherein:
the first, second and third supports extend in a first direction;
the first sensor includes a piezoelectric member that comprises a chiral polymer; and
a uniaxial stretching direction of the piezoelectric member is not parallel to the first direction.

13. An illumination switching device comprising:
a light source;
a switch for turning the light source on and off; and
the detection device according to claim 10, wherein the switch is controlled by the remote receiver as a function of the transmitted signal .

14. The illumination switching device according to claim 13, wherein a determination is made as to whether to turn the light source on or off by (a) the signal comparison unit, (b) a frequency discriminator that determines whether the output generated by the fist sensor is indicative of an intended pressing operation as a function of a frequency of the output of the sensor, or (c) both the signal comparison unit and the frequency discriminator.

15. The detection device according to claim 1, wherein:
the first and second sensors are located on the operation surface; and
the detection device further comprises a surface film which is provided on the operation surface in such a manner that the first and second sensors are sandwiched between the operation surface and the surface film.

16. The detection device according to claim 15, wherein the surface film covers the entire operation surface.

* * * * *